(12) United States Patent
Sano et al.

(10) Patent No.: US 8,206,839 B2
(45) Date of Patent: Jun. 26, 2012

(54) ORGANIC ELECTROLUMINESCENT ELEMENT

(75) Inventors: Satoshi Sano, Kanagawa (JP); Tatsuya Igarashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 947 days.

(21) Appl. No.: 11/542,550

(22) Filed: Oct. 4, 2006

(65) Prior Publication Data

US 2007/0077453 A1    Apr. 5, 2007

(30) Foreign Application Priority Data

Oct. 4, 2005    (JP) .............................. P.2005-291145

(51) Int. Cl.
*H01L 51/54* (2006.01)
(52) U.S. Cl. ........ 428/690; 428/917; 313/504; 313/506; 257/40
(58) Field of Classification Search .................... 257/40, 257/88, 104, E51; 428/690, 917, 411.1, 336; 313/502–509; 556/465, 431; 423/416
See application file for complete search history.

(56) References Cited

U.S. PATENT DOCUMENTS

| | | | | |
|---|---|---|---|---|
| 6,008,299 A * | 12/1999 | McGrath et al. | ............... | 525/255 |
| 6,416,887 B1 * | 7/2002 | Tokito et al. | .................. | 428/690 |
| 2002/0028329 A1 * | 3/2002 | Ise et al. | .......... | 428/336 |
| 2003/0181694 A1 * | 9/2003 | Shirane et al. | ............... | 536/23.1 |
| 2004/0265624 A1 * | 12/2004 | Shitagaki et al. | ............. | 428/690 |
| 2006/0255332 A1 | 11/2006 | Becker et al. | | |
| 2007/0031698 A1 * | 2/2007 | Towns et al. | .................. | 428/690 |
| 2007/0164273 A1 * | 7/2007 | Gerhard et al. | ................. | 257/40 |
| 2007/0170419 A1 | 7/2007 | Gerhard et al. | | |

FOREIGN PATENT DOCUMENTS

| | | |
|---|---|---|
| JP | 8143862 A | 6/1996 |
| JP | 200263989 A | 2/2002 |
| JP | 2003317965 A | 11/2003 |
| JP | 200495221 A | 3/2004 |
| WO | WO 2004/093207 A2 | 10/2004 |
| WO | WO 2004/108857 A1 | 12/2004 |
| WO | 2005003253 A2 | 1/2005 |
| WO | WO-2005/017065 A1 * | 2/2005 |
| WO | WO 2005/042550 A1 | 5/2005 |
| WO | WO 2005/054403 A1 | 6/2005 |
| WO | 2005084082 A1 | 9/2005 |
| WO | WO 2005/084081 A1 | 9/2005 |
| WO | WO 2005/042444 A2 | 12/2005 |
| WO | WO 2006/000388 A1 | 1/2006 |

OTHER PUBLICATIONS

Dedinas, J.; Regan, T. H. J. Phys. Chem. 76 (1972) 3926-3933.*
Yasuhiro Yamaguchi et al., "Nonadiabatic small-polaron hopping electron transport in diphenoquinone-doped polycarbonate" (1991), J. Appl. Phys., vol. 70, No. 1, pp. 3726-3729.
Office Action issued on Mar. 6, 2012 by the Japanese Patent Office in the corresponding Japanese Patent Application No. 2006-271604.

* cited by examiner

*Primary Examiner* — Jennifer Chriss
*Assistant Examiner* — J. L. Yang
(74) *Attorney, Agent, or Firm* — Sughrue Mion, PLLC

(57) ABSTRACT

An organic electroluminescent element, which comprises: a pair of electrodes; and at least one organic layer comprising a light-emitting layer between the pair of electrodes, wherein the at least one organic layer comprises at least one of compounds represented by formula (I):

$$(R_1)_m\text{-}(A_1)_n \qquad (I)$$

wherein $R_1$ represents a substituent; m represents an integer of 2 or more; n represents an integer of 1 or more; and $A_1$ represents a group selected from the group consisting of specific compounds, with the proviso that when m or n is 2 or more, a plurality of $R_1$'s or $A_1$'s may be the same or different.

13 Claims, No Drawings

ORGANIC ELECTROLUMINESCENT ELEMENT

BACKGROUND OF THE INVENTION

1. Field of the Invention

The present invention relates to a light-emitting element capable of converting electrical energy to light to emit light and more particularly to an organic electroluminescent element.

2. Description of the Related Art

Due to its capability of emitting light with a high brightness at a low voltage, an organic electroluminescent (EL) element has been noted as a promising display element and thus has been under active research and development. However, the organic electroluminescent element leaves something to be desired in enhancement of durability and emission efficiency and reduction of required driving voltage and thus has been desired to have further improvement. Organic electroluminescent elements which comprise a compound having specific spirofluorene skeletons connected to each other with carbonyl group to enhance the emission efficiency thereof have been disclosed (see, e.g., International Patent Publication No. 05/054403 pamphlet and International Patent Publication No. 04/093207 pamphlet). However, these proposals leave something to be desired in durability and emission efficiency. When combined with a light-emitting material having a shorter emission wavelength, these proposals leave more to be desired in efficiency and durability. Referring to light-emitting materials, on the other hand, elements containing a phosphorescent material such as tetradentate platinum complex (e.g., phenylpyridine-platinum complex, phenoxypyridine-platinum complex) have been found to attain a high emission efficiency and thus have been noted (see, e.g., International Patent Publication No. 05/042550 pamphlet, International Patent Publication No. 05/042444 pamphlet and International Patent Publication No. 04/108857 pamphlet).

SUMMARY OF THE INVENTION

An aim of the invention is to provide a light-emitting element having a low required driving voltage.

The aforementioned aim of the invention can be accomplished by the following constitutions.

(1) An organic electroluminescent element, which comprises:

a pair of electrodes; and at least one organic layer comprising a light-emitting layer between the pair of electrodes, wherein the at least one organic layer comprises at least one of compounds represented by formula (I):

$$(R_1)_m\text{-}(A_1)_n \quad (I)$$

Compound group (I):

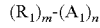

(a)

(b)

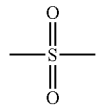

(c)

(d)

(e)

(f)

(g)

(h)

(i)

(j)

(k)

(l)

(m)

wherein $R_1$ represents a substituent;

m represents an integer of 2 or more;

n represents an integer of 1 or more; and $A_1$ represents a group selected from the group consisting of compound group (I), with the proviso that when m or n is 2 or more, a plurality of $R_1$'s or $A_1$'s may be the same or different.

(2) The organic electrolumninescent element as described in (1) above, wherein $R_1$ in formula (I) is a substituted or unsubstituted aryl group, a substituted or unsubstituted heterocyclic group or a substituted or unsubstituted amino group.

(3) The organic electroluminescent element as described in (1) above, wherein the compound represented by formula (I) is a compound represented by formula (II):

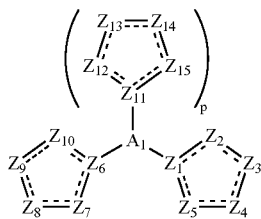

(II)

wherein $Z_1$ to $Z_{15}$ each independently represents an atomic group selected from the group consisting of carbon, nitrogen, oxygen, sulfur, silicon and phosphorus required to form an unsaturated 5-membered ring, with the proviso that when the atomic group constituting the unsaturated 5-membered ring formed by $Z_1$ to $Z_{15}$ can be substituted, the atomic group may have a substituent, and that bonds constituting the unsaturated 5-membered ring each may be a single bond or a double bond;

p represents 0 or 1; and $A_1$ is as defined in formula (I).

(4) The organic electroluminescent element as described in (1) above, wherein the compound represented by formula (I) is a compound represented by formula (III):

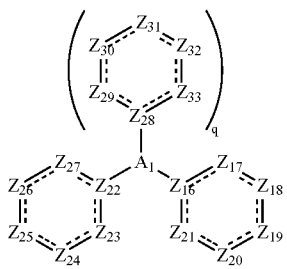

(III)

wherein $Z_{16}$ to $Z_{33}$ each independently represents an atomic group selected from the group consisting of carbon, nitrogen, oxygen, sulfur, silicon and phosphorus required to form an unsaturated 6-membered ring, with the proviso that when the atomic group constituting the unsaturated 6-membered ring formed by $Z_{16}$ to $Z_{33}$ can be substituted, the atomic group may have a substituent, and that bonds constituting the unsaturated 6-membered ring each may be a single bond or a double bond;

q represents 0 or 1; and $A_1$ is as defined in formula (I).

(5) The organic electroluminescent element as described in (1) above, wherein the compound represented by formula (I) is a compound represented by formula (IV):

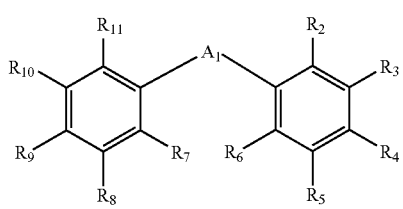

(IV)

wherein $R_2$, $R_6$, $R_7$ and $R_{11}$ each independently represents a substituent;

$R_3$, $R_4$, $R_5$, $R_8$, $R_9$ and $R_{10}$ each independently represents a hydrogen atom or a substituent; and $A_1$ is as defined in formula (I).

(6) The organic electroluminescent element as described in (1) above, wherein the compound represented by formula (I) is a compound represented by formula (V):

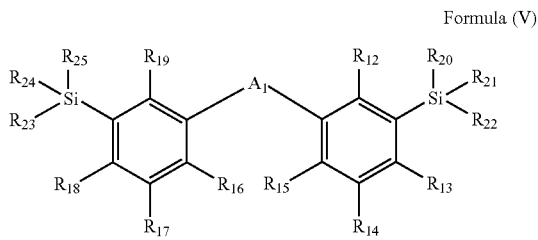

Formula (V)

wherein $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$ and $R_{25}$ each independently represents a hydrogen atom or a substituent; and $A_1$ is as defined in formula (I).

(7) The organic electroluminescent element as described in any of (1) to (6) above, wherein $A_1$ in formulae (I) to (V) is a group selected from the group consisting of groups (a), (b), (c), (d), (e) and (h) among the compound group (I).

(8) The organic electroluminescent element as described in any of (1) to (7) above, wherein $A_1$ in formulae (I) to (V) is a group (c) among the compound group (I).

(9) The organic electroluminescent element as described in any of (1) to (8) above, wherein the light-emitting layer comprises at least one triplet light-emitting material.

(10) The organic electroluminescent element as described in (9) above, wherein the at least one triplet light-emitting material contained in the light-emitting layer is a platinum complex or an iridium complex.

(11) The organic electroluminescent element as described in any of (1) to (10) above, wherein the lowest excited triplet energy level $T_1$ of the compound represented by any of formulae (I) to (V) is from not lower than 65 kcal/mol (272.35 kJ/mol) to not higher than 95 kcal/mol (398.05 kJ/mol).

(12) The organic electroluminescent element as described in any of (1) to (11) above, wherein a glass transition temperature Tg of the compound represented by any of formulae (I) to (V) is from not lower than 130° C. to not higher than 400° C.

DETAILED DESCRIPTION OF THE INVENTION

In the invention, the compound represented by the formula (I), (II), (III), (IV) or (V) has the same meaning as the "compound of the invention". The organic electroluminescent element having an organic layer containing the compound of the invention has the same meaning as the "element of the invention". In the invention, the substituent group A is defined as follows.

(Substituent Group A)

Examples of the substituent group A include alkyl groups (preferably a $C_1$-$C_{30}$, more preferably a $C_1$-$C_{20}$, particularly preferably a $C_1$-$C_{10}$ alkyl group, e.g., methyl, ethyl, iso-propyl, tert-butyl, n-octyl, n-decyl, n-hexadecyl), cycloalkyl groups (preferably a $C_3$-$C_{30}$, more preferably a $C_1$-$C_{20}$, particularly preferably a $C_3$-$C_{10}$ cycloalkyl group, e.g., cyclopropyl, cyclopentyl, cyclohexyl), alkenyl groups (preferably a $C_2$-$C_{30}$, more preferably a $C_2$-$C_{20}$, particularly preferably a $C_2$-$C_{10}$ alkenyl group, e.g., vinyl, allyl, 2-butenyl, 3-pentenyl), alkynyl groups (preferably a $C_2$-$C_{30}$, more preferably a $C_2$-$C_{20}$, particularly preferably a $C_2$-$C_{10}$ alkynyl group, e.g., propargyl, 3-pentynyl), aryl groups (preferably a $C_6$-$C_{30}$, more preferably a $C_6$-$C_{20}$, particularly preferably a $C_6$-$C_{12}$ aryl group, e.g., phenyl, p-methylphenyl, naphthyl, anthranyl), amino groups (preferably a $C_0$-$C_{30}$, more preferably a $C_0$-$C_{20}$, particularly preferably a $C_0$-$C_{10}$ amino group, e.g., amino, methylamino, dimethylamino, diethylamino, dibenzylamino, diphenylamino, ditollylamino), alkoxy groups (preferably a $C_1$-$C_{30}$, more preferably a $C_1$-$C_{20}$, particularly preferably a $C_1$-$C_{10}$ alkoxy group, e.g., methoxy, ethoxy, butoxy, 2-ethylhexyloxy), aryloxy groups (preferably a $C_6$-$C_{30}$, more preferably a $C_6$-$C_{20}$, particularly preferably a $C_6$-$C_{12}$ aryloxy group, e.g., phenyloxy, 1-naphthyloxy, 2-naphthyloxy), heterocyclic oxy groups (preferably a $C_1$-$C_{30}$, more preferably a $C_1$-$C_{20}$, particularly preferably a $C_1$-$C_{12}$ heterocyclic oxy group, e.g., pyridyloxy, pyrazyloxy, pyrimidyloxy, quinolyloxy), acyl groups (preferably a $C_1$-$C_{30}$, more preferably a $C_1$-$C_{20}$, particularly preferably a $C_1$-$C_{12}$ acyl group, e.g., acetyl, benzoyl, formyl, pivaloyl), alkoxycarbonyl groups (preferably a $C_2$-$C_{30}$, more preferably a $C_2$-$C_{20}$, particularly preferably a $C_2$-$C_{12}$ alkoxycarbonyl group, e.g., methoxycarbonyl, ethoxycarbonyl), aryloxycarbonyl groups (preferably a $C_7$-$C_{30}$, more preferably a $C_7$-$C_{20}$, particularly preferably a $C_7$-$C_{12}$ aryloxycarbonyl group, e.g., phenyloxycarbonyl), acyloxy groups (preferably a $C_2$-$C_{30}$, more preferably a $C_2$-$C_{20}$, particularly preferably a $C_2$-$C_{10}$ acyloxy group, e.g., acetoxy, benzoyloxy), acylamino groups (preferably a $C_2$-$C_{30}$, more preferably a $C_2$-$C_{20}$, particularly preferably a $C_2$-$C_{10}$ acylamino group, e.g., acetylamino, benzoylamino), alkoxycarbonylamino groups (preferably a $C_2$-$C_{30}$, more preferably a $C_2$-$C_{20}$, particularly preferably a $C_2$-$C_{12}$ alkoxycarbonylamino group, e.g., methoxycarbonylamino), aryloxycarbonylamino groups (preferably a $C_7$-$C_{30}$, more preferably a $C_7$-$C_{20}$, particularly preferably a $C_7$-$C_{12}$ aryloxycarbonylamino group, e.g., phenyloxycarbonylamino), sulfonylamino groups (preferably a $C_1$-$C_{30}$, more preferably a $C_1$-$C_{20}$, particularly preferably a $C_1$-$C_{12}$ sulfonylamino group, e.g., methanesulfonylamino, benzenesulfonylamino), sulfamoyl groups (preferably a $C_0$-$C_{30}$, more preferably a $C_0$-$C_{20}$, particularly preferably a $C_0$-$C_{12}$ sulfamoyl group, e.g., sulfamoyl, methylsulfamoyl, dimethylsulfamoyl, phenylsulfamoyl), carbamoyl groups (preferably a $C_1$-$C_{30}$, more preferably a $C_1$-$C_{20}$, particularly preferably a $C_1$-$C_{12}$ carbamoyl group, e.g., carbamoyl, methyl carbamoyl, diethyl carbamoyl, phenyl carbamoyl), alkylthio groups (preferably a $C_1$-$C_{30}$, more preferably a $C_1$-$C_{20}$, particularly preferably a $C_1$-$C_{12}$ alkylthio group, e.g., methylthio, ethylthio), arylthio groups (preferably a $C_6$-$C_{30}$, more preferably a $C_6$-$C_{20}$, particularly preferably a $C_6$-$C_{12}$ arylthio group, e.g., phenylthio), heterocyclic thio groups (preferably a $C_1$-$C_{30}$, more preferably a $C_1$-$C_{20}$, particularly preferably a $C_1$-$C_{12}$ heterocyclic thio group, e.g., pyridylthio, 2-benzimidazolylthio, 2-benzoxazolythio, 2-benzthiazolylthio), sulfonyl groups (preferably a $C_1$-$C_{30}$, more preferably a $C_1$-$C_{20}$, particularly preferably a $C_1$-$C_{12}$ sulfonyl group, e.g., mesyl, tosyl), sulfinyl groups (preferably a $C_1$-$C_{30}$, more preferably a $C_1$-$C_{20}$, particularly preferably a $C_1$-$C_{12}$ sulfinyl group, e.g., methanesulfinyl, benzenesulfinyl), ureido groups (preferably a $C_1$-$C_{30}$, more preferably a $C_1$-$C_{20}$, particularly preferably a $C_1$-$C_{12}$ ureido group, e.g., ureido, methylureido, phenylureido), phosphoric acid amide groups (preferably a $C_1$-$C_{30}$, more preferably a $C_1$-$C_{20}$, particularly preferably a $C_1$-$C_{12}$ phosphoric acid amide group, e.g., amide diethylphosphate, amide phenylphosphate), hydroxyl groups, mercapto groups, halogenatoms (e.g., fluorine, chlorine, bromine, iodine, preferably fluorine), cyano groups, sulfo groups, carboxyl groups, nitro groups, hydroxamic acid groups, sulfino groups, hydrazino groups, imino groups, heterocyclic groups (preferably a $C_1$-$C_{30}$, more preferably a $C_1$-$C_{12}$ heterocyclic group having nitrogen atom, oxygen atom or sulfur atom as hetero atom, e.g., imidazolyl, pyridyl, quinolyl, furyl, piperidyl, morpholino, benzooxazolyl, benzimidazolyl, benzthiazolyl, carbazolyl, azepinyl), silyl groups (preferably a $C_3$-$C_{40}$, more preferably a $C_3$-$C_{30}$, particularly preferably a $C_3$-$C_{24}$ silyl group, e.g., trimethylsilyl, triphenylsilyl), and silyloxy groups (preferably a $C_3$-$C_{40}$, more preferably a $C_3$-$C_{30}$, particularly preferably a $C_3$-$C_{24}$ silyloxy group, e.g., trimetylsilyloxy, triphenylsilyloxy). These substituents may be further substituted.

The formula (I) will be further described hereinafter.

In the formula (I), $R_1$ represents a substituent which is selected from the group consisting of the aforementioned substituent group A. The suffix m represents an integer of 2 or more. The suffix n represents an integer of 1 or more. $A_1$ represents a group selected from the group consisting of the aforementioned compound group (I). When m or n is 2 or more, the plurality of $R_1$'s or $A_1$'s may be the same or different.

A preferred range of the formula (I) will be described below. In the formula (I), $R_1$ is preferably an alkyl group, cycloalkyl group, alkenyl group, alkynyl group, aryl group, amino group, alkoxy group, aryloxy group, heterocyclic oxy group, alkoxycarbonyl group, aryloxycarbonyl group, acyloxy group, acylamino group, alkoxycarbonylamino group, aryloxycarbonylamino group, sulfonylamino group, alkylthio group, arylthio group, heterocyclic thio group, hydrazino group or heterocyclic group, more preferably an alkyl group, cycloalkyl group, aryl group, heterocyclic group or amino group, even more preferably an alkyl group, cycloalkyl group, aryl group, heterocyclic group or amino group, still more preferably an aryl group, heterocyclic group or amino group. These preferred examples of $R_1$ are the same as described with reference to the substituent group (A).

$A_1$ is preferably selected from the group consisting of the compounds (a), (b), (c), (d), (e), (h), (i), (j), (k), (l) and (m), more preferably (a), (b), (c), (d), (e) and (h), even more preferably (a), (c) and (d), most preferably (c) in the aforementioned compound group (I). The suffix m represents an integer of 2 or more, preferably from not smaller than 2 to not greater than 5, even more preferably 2 or 3. The suffix n represents an integer of 1 or more, preferably from not smaller than 1 to not greater than 4, even more preferably from not smaller than 1 to not greater than 3, still more preferably 1 or 2, most preferably 1.

The relationship of the formulae in the invention are as follows. In some detail, the formula (I) is preferably the formula (II) or (III). The formula (III) is preferably the formula (IV) or (V).

The formula (II) will be further described hereinafter. In the formula (II), $Z_1$ to $Z_{15}$ each independently represent an atomic group selected from the group consisting of carbon, nitrogen, oxygen, sulfur, silicon and phosphorus required to form an unsaturated 5-membered ring. When the atomic group constituting the unsaturated 5-membered ring formed by $Z_1$ to $Z_{15}$ can be substituted, the unsaturated 5-membered ring may have substituents. The bonds constituting the unsaturated 5-membered ring each may be any of combinations of single bond and double bond. $Z_1$ to $Z_{15}$ are preferably formed by carbon, nitrogen, silicon, sulfur and oxygen, more preferably carbon, nitrogen and silicon, even more preferably carbon and nitrogen. Particularly preferably, $Z_1$ to $Z_{15}$ each are selected from the group consisting of carbon and nitrogen atoms and the unsaturated rings formed by $Z_1$, $Z_2$, $Z_3$, $Z_4$ and $Z_5$, $Z_6$, $Z_7$, $Z_8$, $Z_9$ and $Z_{10}$ and $Z_{10}$, $Z_{11}$, $Z_{12}$, $Z_{13}$, $Z_{14}$ and $Z_{15}$ each represent a substituted or unsubstituted pyrazole ring, imidazole ring or triazole ring. When the atomic group constituting $Z_1$ to $Z_{15}$ can be further substituted, the unsaturated ring may have substituents. The plurality of substituents may be connected to each other to form a condensed ring. The suffix p represents 0 or 1, preferably 0. $A_1$ is as defined in the formula (I), including its preferred range.

The formula (III) will be further described hereinafter. In the formula (III), $Z_{16}$ to $Z_{33}$ each independently represent an atomic group selected from the group consisting of carbon, nitrogen, oxygen, sulfur, silicon and phosphorus required to form an unsaturated 6-membered ring. When the atomic group constituting the unsaturated 5-membered ring formed by $Z_{16}$ to $Z_{33}$ can be substituted, the unsaturated 6-membered ring may have substituents. The bonds constituting the unsaturated 6-membered ring each may be any of combinations of single bond and double bond. $Z_{16}$ to $Z_{33}$ are preferably formed by carbon, nitrogen, silicon, sulfur and oxygen, more preferably carbon, nitrogen and silicon, even more preferably carbon and nitrogen. Particularly preferably, $Z_{16}$ to $Z_{33}$ each are selected from the group consisting of carbon and nitrogen atoms and the unsaturated rings formed by $Z_{16}$, $Z_{17}$, $Z_{18}$, $Z_{19}$, $Z_{20}$ and $Z_{21}$ and $Z_{22}$, $Z_{23}$, $Z_{24}$, $Z_{25}$, $Z_{26}$ and $Z_{27}$ and $Z_{28}$, $Z_{29}$, $Z_{30}$, $Z_{31}$, $Z_{32}$ and $Z_{33}$ each represent a substituted or unsubstituted benzene ring, pyridine ring, pyrazine ring, pyrimidine ring or pyridazine ring. When the atomic group constituting $Z_{16}$ to $Z_{33}$ can be further substituted, the unsaturated ring may have substituents. The plurality of substituents may be connected to each other to form a condensed ring. The suffix q represents 0 or 1, preferably 0. $A_1$ is as defined in the formula (I), including its preferred range.

The formula (IV) will be further described hereinafter. In the formula (IV), $R_2$, $R_6$, $R_7$ and $R_{11}$ each represent a substituent and $R_3$, $R_4$, $R_5$, $R_8$, $R_9$ and $R_{10}$ each represent a hydrogen atom or substituent. The substituents represented by $R_2$ to $R_{11}$ each are selected from the group consisting of the aforementioned substituent group (A). $R_2$, $R_6$, $R_7$ and $R_{11}$ each are preferably an alkyl group, cycloalkyl group, alkenyl group, alkynyl group, aryl group, amino group, alkoxy group, aryloxy group, heterocyclic oxy group, alkylthio group, arylthio group, heterocyclic thio group, heterocyclic group, hydroxyl group, halogen atom or cyano group, more preferably an alkyl group, cycloalkyl group, aryl group, heterocyclic group or halogen atom, even more preferably an aryl group or heterocyclic group. $R_3$, $R_4$, $R_5$, $R_8$, $R_9$ and $R_{10}$ each are preferably a hydrogen atom, alkyl group, cycloalkyl group, alkenyl group, alkynyl group, aryl group, amino group, alkoxy group, aryloxy group, heterocyclic oxy group, alkylthio group, arylthio group, heterocyclic thio group, heterocyclic group, hydroxyl group, halogen atom or cyano group, more preferably a hydrogen atom, alkyl group, cycloalkyl group, aryl group, heterocyclic group or halogen atom, even more preferably a hydrogen atom, aryl group or heterocyclic group. When $R_2$ to $R_{11}$ each represent a substituent, the plurality of substituents may be connected to each other to form a condensed ring.

$A_1$ is as defined in the formula (I), including its preferred range.

The formula (V) will be further described hereinafter. In the formula (V), $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$ and $R_{25}$ each independently represents a hydrogen atom or a substituent; in case that $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$ and $R_{25}$ each independently represents a substituent, the substituent is selected from the aforementioned substituents group (A) and the substituent is preferably a hydrogen atom, alkyl group, cycloalkyl group, alkenyl group, alkynyl group, aryl group, alkoxy group, aryloxy group, heterocyclic oxy group, alkylthio group, arylthio group, heterocyclic thio group, heterocyclic group, halogen atom, and cyano group, more preferably a hydrogen atom, alkyl group, cycloalkyl group, aryl group, heterocyclic group and halogen atom, and still more preferably a hydrogen atom or aryl group; in case that $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$ and $R_{25}$ each independently represents a substituent, the plurality of substitutents may be connected to each other to form a condensed ring.

$A_1$ is as defined in the formula (I), including its preferred range.

The lowest excited triplet energy level (hereinafter occasionally referred to as "$T_1$") of the compound represented by any of the formulae (I) to (V) is preferably from not smaller than 65 kcal/mol (272.35 kJ/mol) to not greater than 95 kcal/mol (398.05 kJ/mol), more preferably from not smaller than 65 kcal/mol (272.35 kJ/mol) to not greater than 80 kcal/mol (335.2 kJ/mol), even more preferably from not smaller than 65 kcal/mol (272.35 kJ/mol) to not greater than 75 kcal/mol (314.3 kJ/mol), particularly preferably from not smaller than 65 kcal/mol (272.35 kJ/mol) to not greater than 70 kcal/mol (293.3 kJ/mol).

For the lowest excited triplet energy level of compounds, reference can be made to Haruo Inoue, Katsuhiko Takagi, Masako Sasaki and Kyoshin Boku, "Hikarikagaku (Photochemistry) I", pp. 34-38, Maruzen, 1999, Katsumi Tokumaru, "Hikarikagaku no Sekai (The World of Photochemistry)", pp. 48-54, Dainippon Tosho, 1993, etc. The lowest excited triplet energy level of compounds can be calculated by the methods described in these citations.

The compound represented by any of the formulae (I) to (V) preferably exhibits a glass transition temperature (hereinafter abbreviated as "Tg") of from not lower than 130° C. to not higher than 400° C., more preferably from not lower than 140° C. to 350° C., even more preferably from not lower than 150° C. to not higher than 300° C. from the standpoint of depositability, thermal stability, amorphism of film and inhibition of crystallization.

The compound of the invention may be a low molecular compound or may be an oligomer compound or polymer compound (mass-average molecular weight (as calculated in terms of polystyrene): preferably from 1,000 to 5,000,000, more preferably from 2,000 to 1,000,000, even more preferably from 3,000 to 100,000). When the compound of the invention is a polymer compound, the structure represented by any of the formulae (I) to (V) may be incorporated in the polymer main chain or polymer side chains. The polymer compound as compound of the invention may be a homopolymer compound or copolymer. The compound of the invention is preferably a low molecular compound.

The compound of the invention may be applied to organic EL elements and may be used as any of a light-emitting material, host material, exciton-blocking material, charge-blocking material or charge-transporting material, preferably a light-emitting material, host material, exciton-blocking material or charge-transporting material, more preferably a host material, exciton-blocking material or charge-transporting material, still more preferably a charge-transporting material. The light-emitting material may be ultraviolet-emitting, visible light-emitting or infrared-emitting or may be fluorescence or phosphorescence.

In case that the compound of the invention is to be contained as a light-emitting material in a light-emitting layer, the compound of the invention is contained at preferably 0.5% by mass to 99.5% by mass, more preferably 1% by mass to 30% by mass, and particularly preferably 1% by mass to 10% by mass in the light-emitting layer.

In case that the compound of the invention is to be contained as a host material in a light-emitting layer, the compound of the invention is contained at preferably 0.5% by mass to 99.5% by mass, more preferably 70% by mass to 99% by mass, and particularly preferably 90% by mass to 99% by mass in the light-emitting layer.

In case that the compound of the invention is to be contained in a layer except a light-emitting layer, the compound of the invention is contained at preferably 1% by mass to 100% by mass, more preferably 5% by mass to 100% by mass, and particularly preferably 10% by mass to 100% by mass.

Examples of the compound of the invention will be given below, but the invention is not limited thereto.

(1)
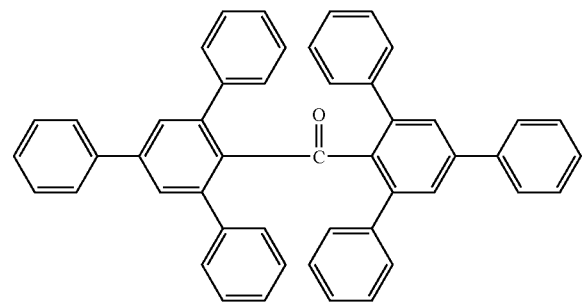

(2)
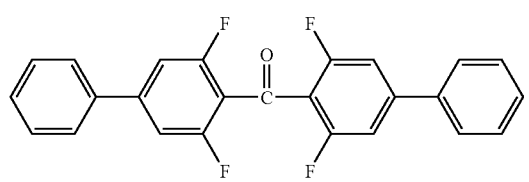

(3)
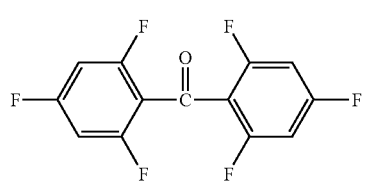

-continued (4)
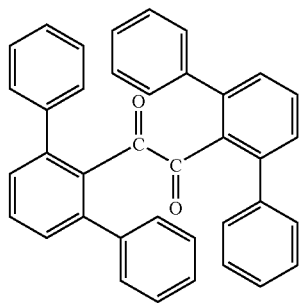

(5)
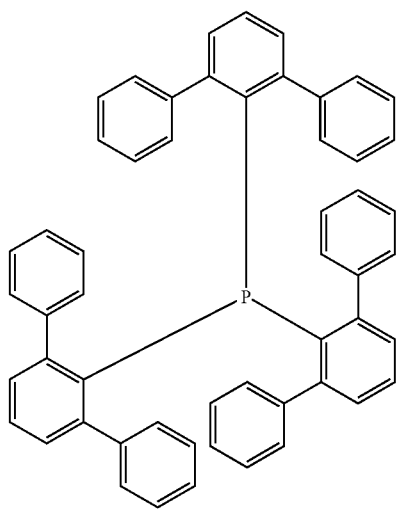

(6)
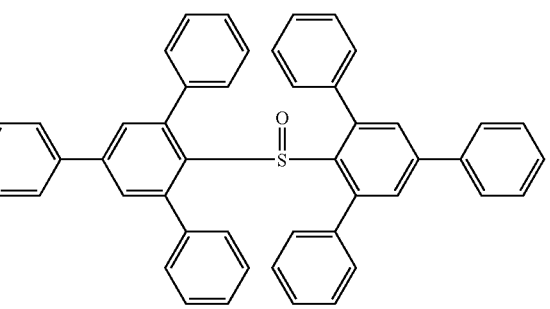

(7)
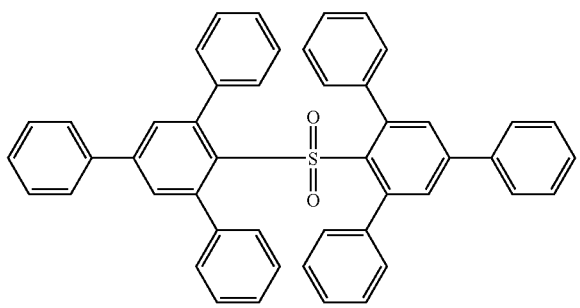

(8)
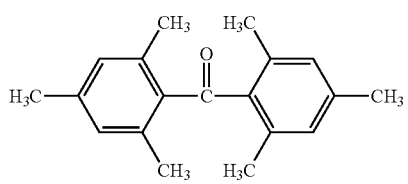

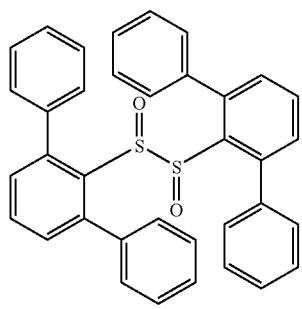
(9)
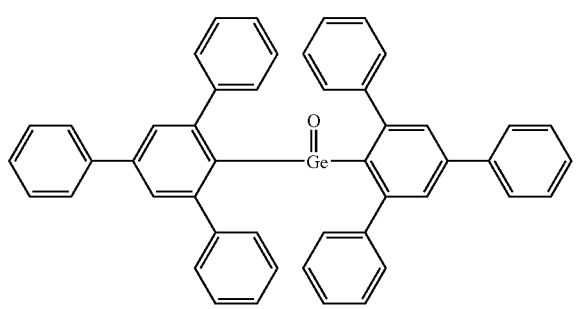
(10)
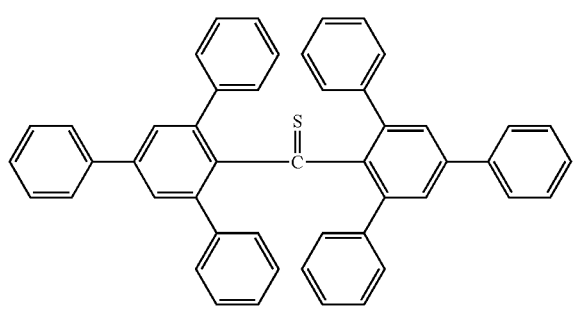
(11)
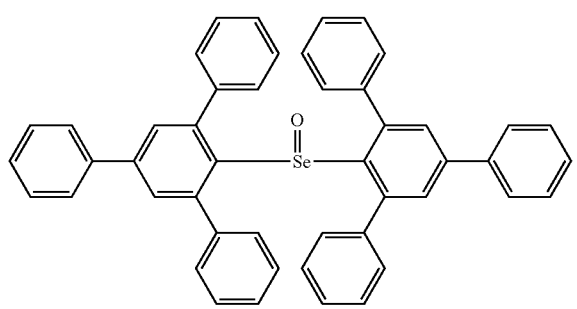
(12)
(13)
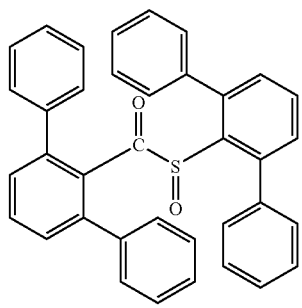
(14)
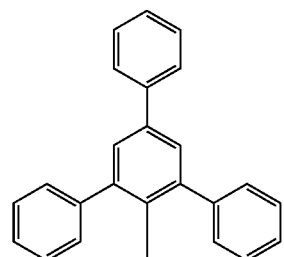
(15)
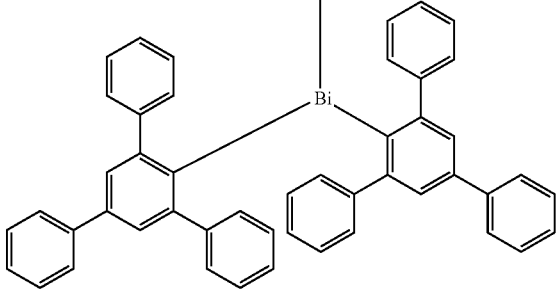
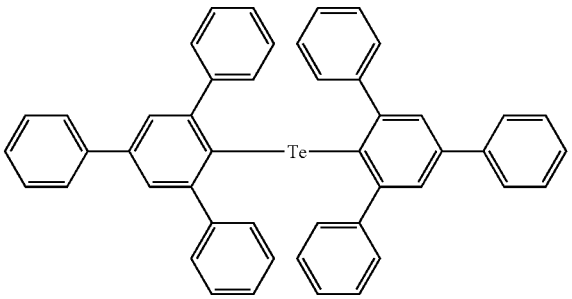
(16)
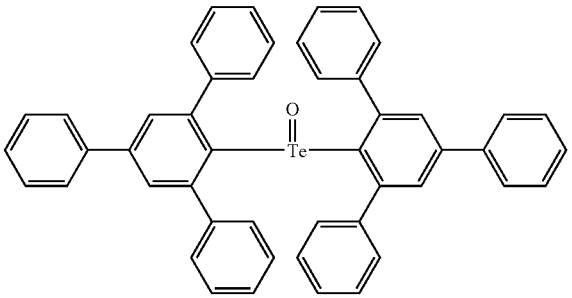
(17)

(18)
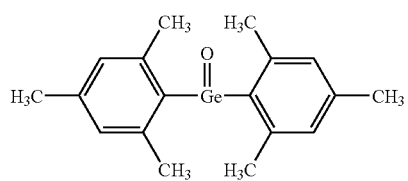
(19)
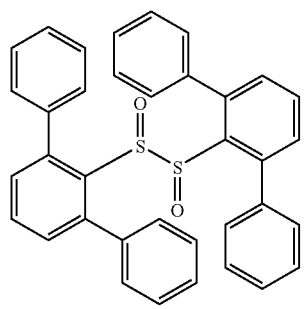
(20)
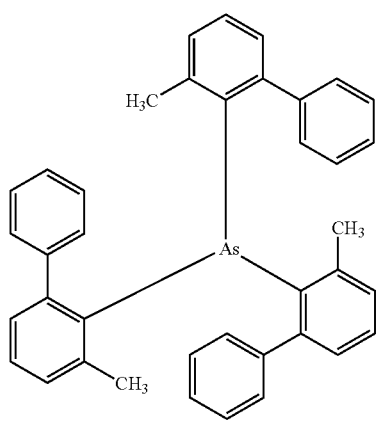
(21)
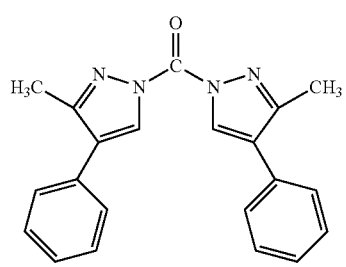
(22)
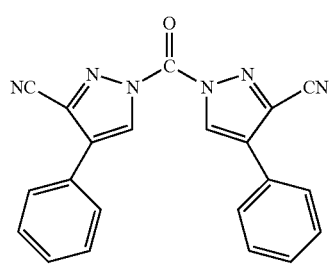
(23)
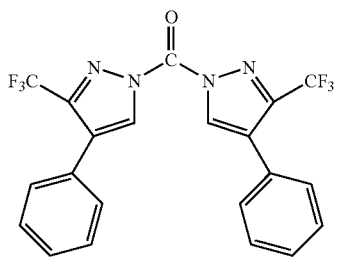
(24)
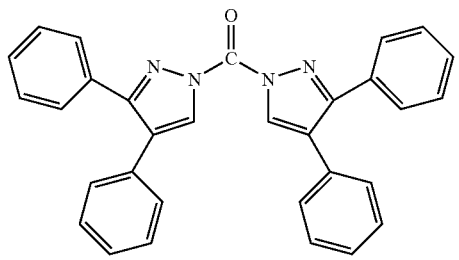
(25)
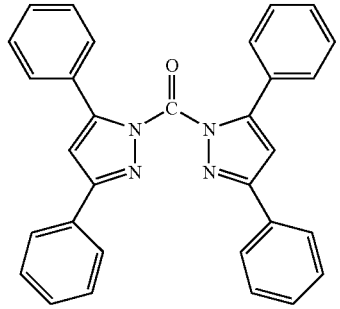
(26)
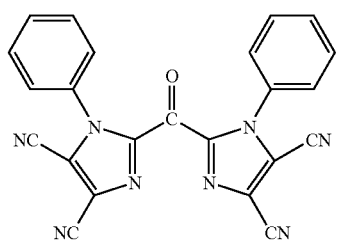
(27)
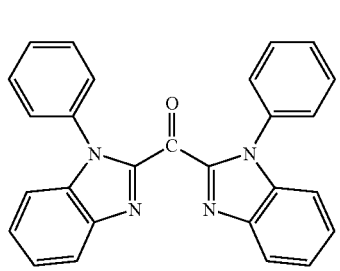
(28)
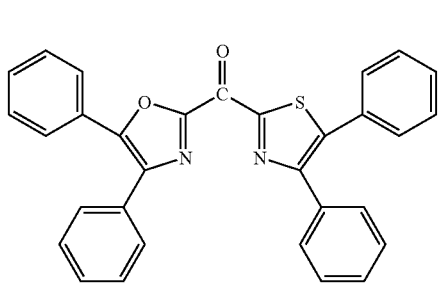

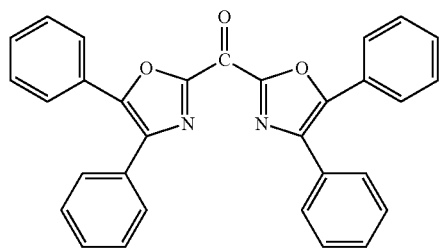
(29)
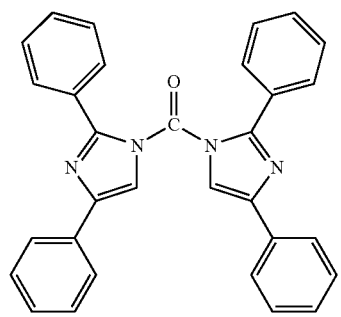
(30)
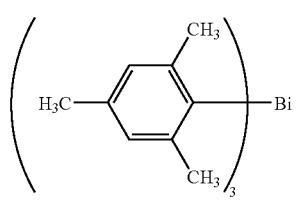
(31)
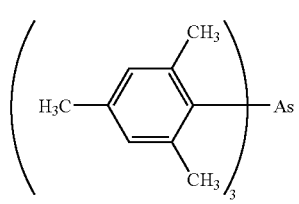
(32)
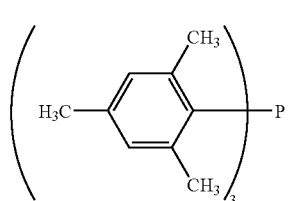
(33)
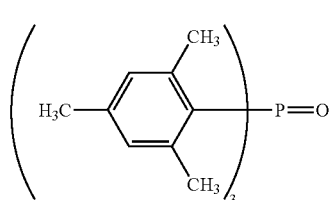
(34)
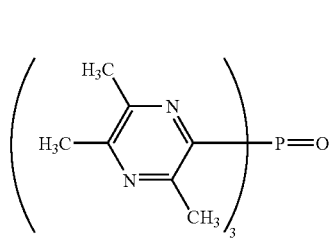
(35)
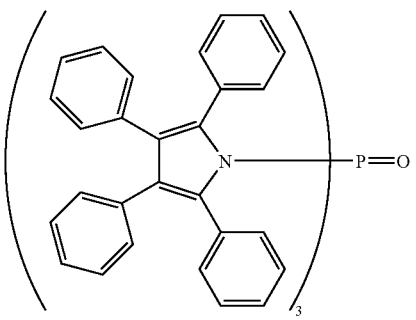
(36)
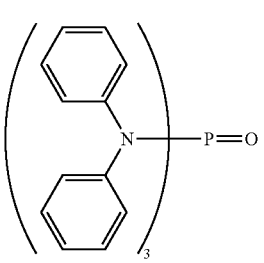
(37)
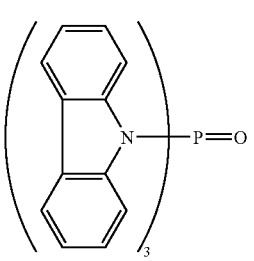
(38)
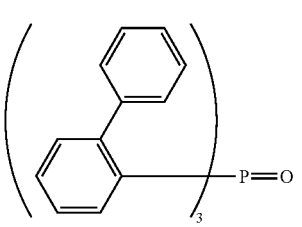
(39)
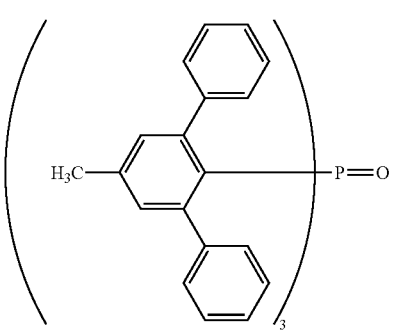
(40)

(41)
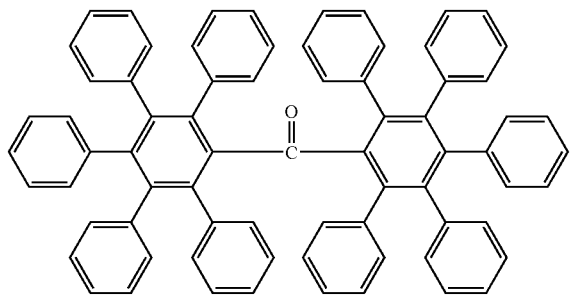
(42)
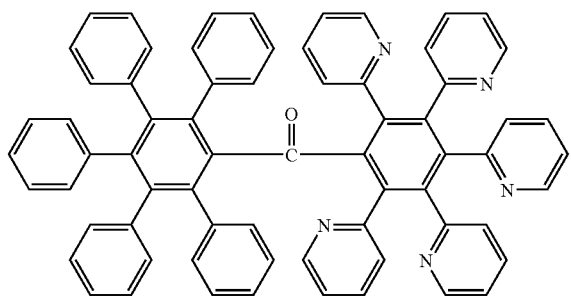
(43)
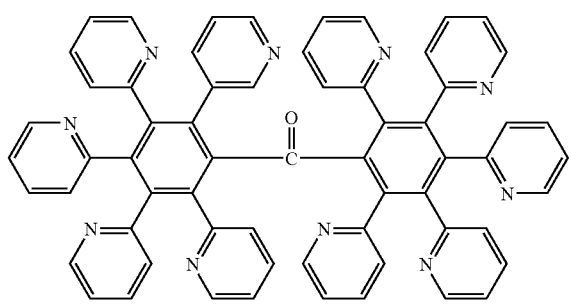
(44)
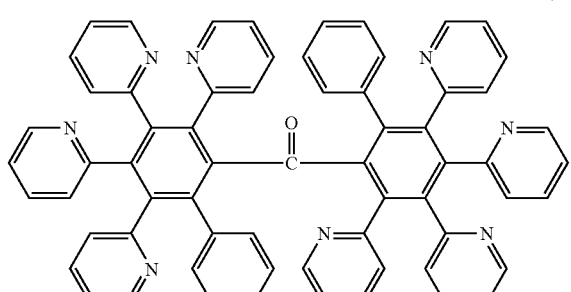
(45)
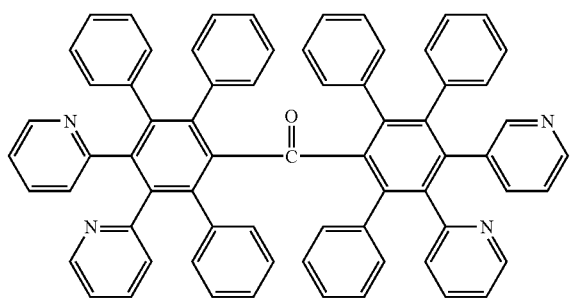
(46)
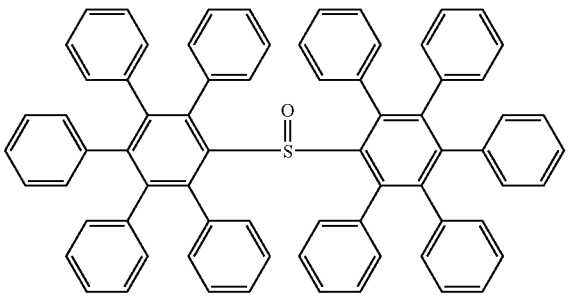
(47)
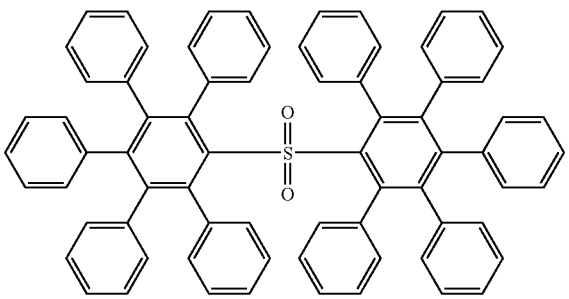
(48)
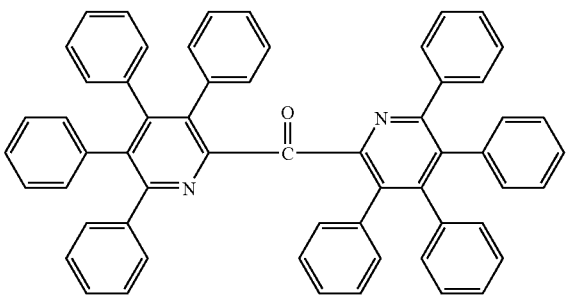
(49)
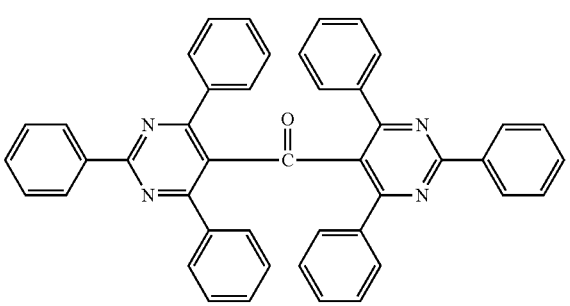
(50)
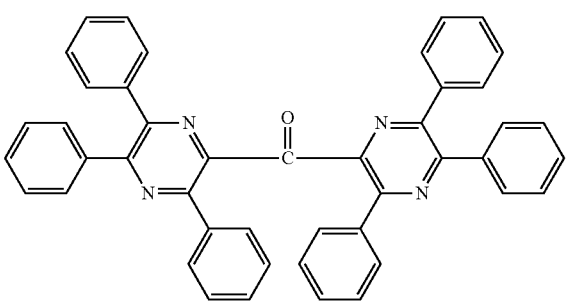

(51)
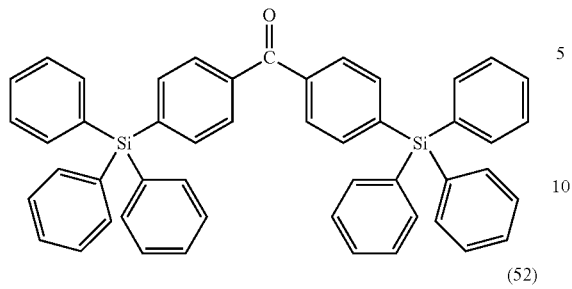
(52)
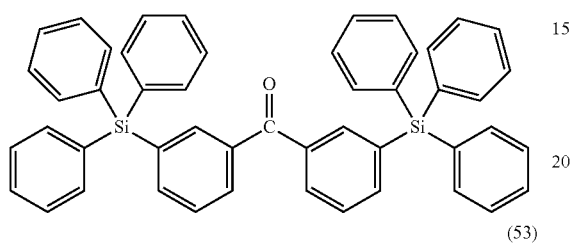
(53)
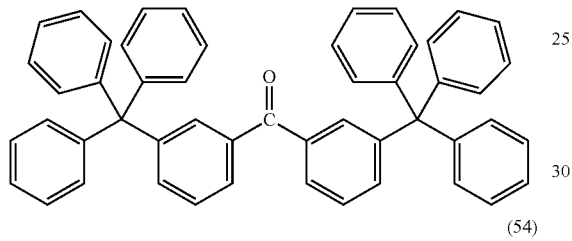
(54)
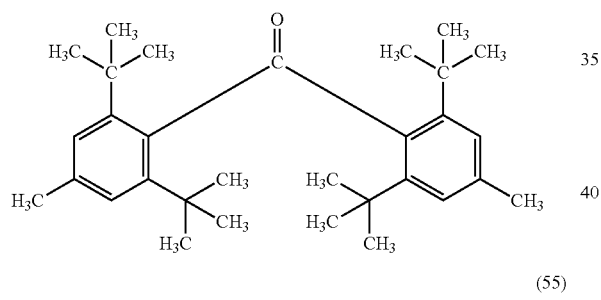
(55)
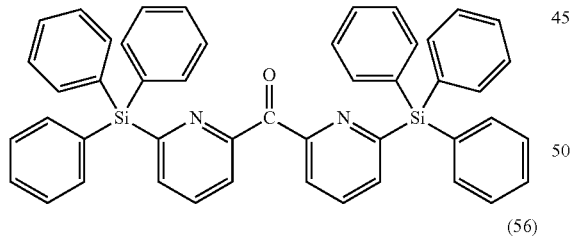
(56)
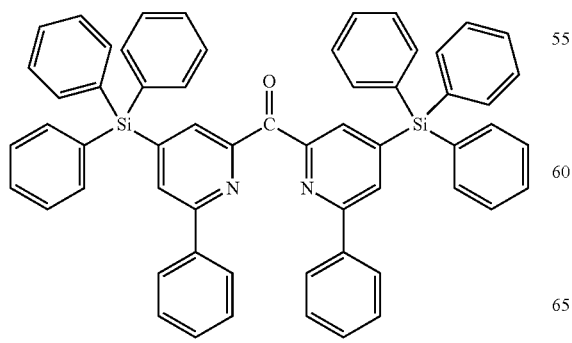
(57)
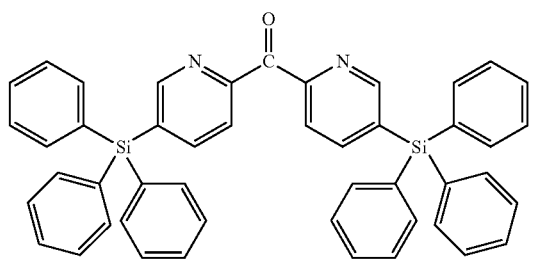
(58)
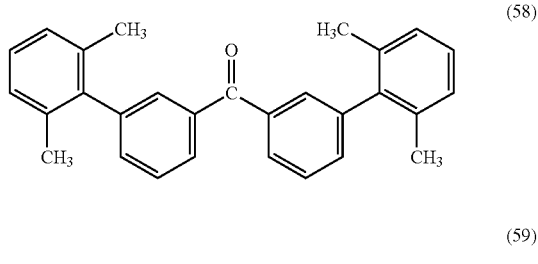
(59)
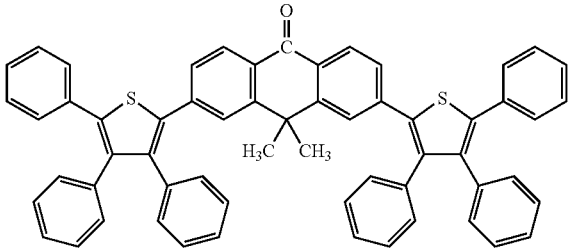
(60)
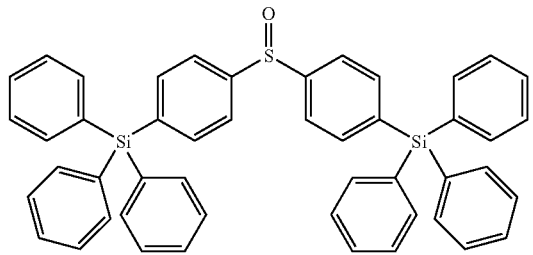
(61)
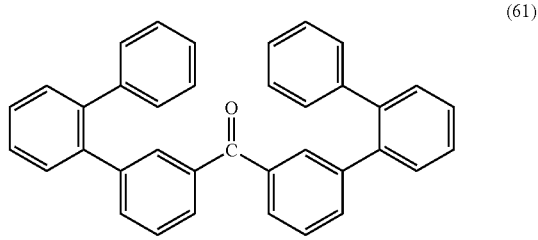
(62)
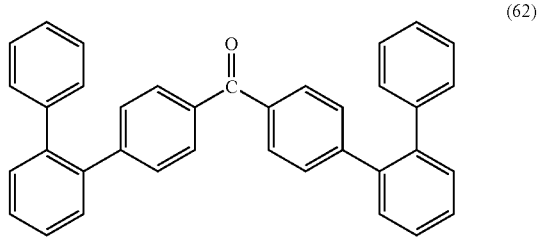

(63)
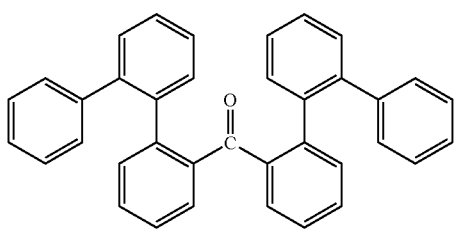

(64)
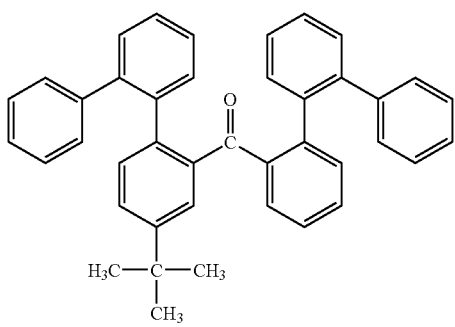

(65)
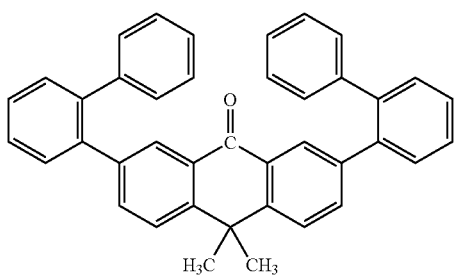

(66)
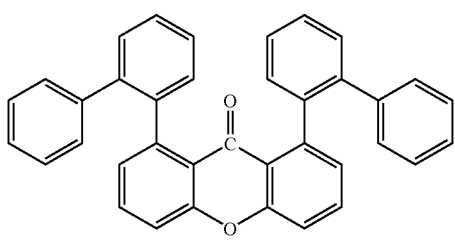

(67)
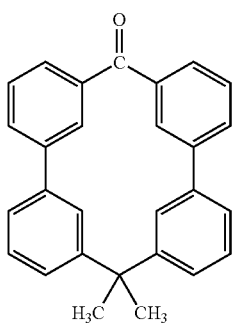

(68)
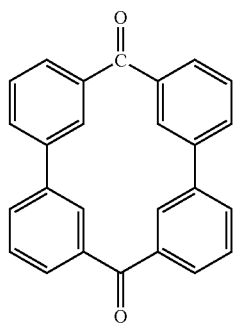

(69)
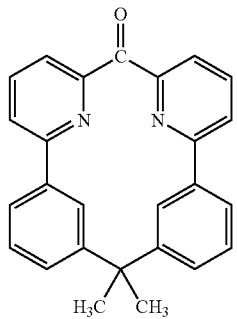

(70)
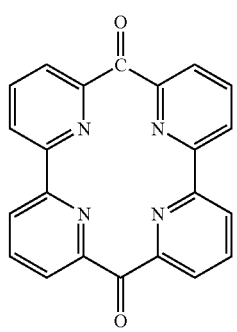

The exemplified compound (1) in the inventive compounds represented by the formula (I) can be synthetically prepared according to Journal of the American Chemical Society, 57, 367-368, (1935); and the exemplified compound (41) therein can be synthetically prepared according to Tetrahedron, 24, 4285-4297, (1968) Exemplified compounds other than those described above may be synthetically prepared with reference to the methods described in Organometallics, 20, 418-423, (2001) and the like. But the methods for synthetic preparation thereof are not limited to the methods described herein.

The reaction time during which the compound represented by any of the formulae (I) to (V) of the invention is synthesized depends on the reaction activity and thus is not specifically limited but is preferably from not shorter than 1 minute to not longer than 5 days, more preferably from not shorter than 5 minutes to not longer than 3 days, even more preferably from not shorter than 10 minutes to not longer than 24 hours.

The reaction temperature at which the compound represented by any of the formulae (I) to (V) of the invention is synthesized depends on the reaction activity and thus is not specifically limited but is preferably from not lower than 0° C. to not higher than 300° C., more preferably not lower than 5° C. to 250° C., even more preferably from not lower than 10° C. to not higher than 200° C.

Specific examples of the synthesis of Exemplary Compounds (52) and (61) among the aforementioned compounds represented by any of the formulae (I) to (V) of the invention will be given below, but the invention is not limited thereto.

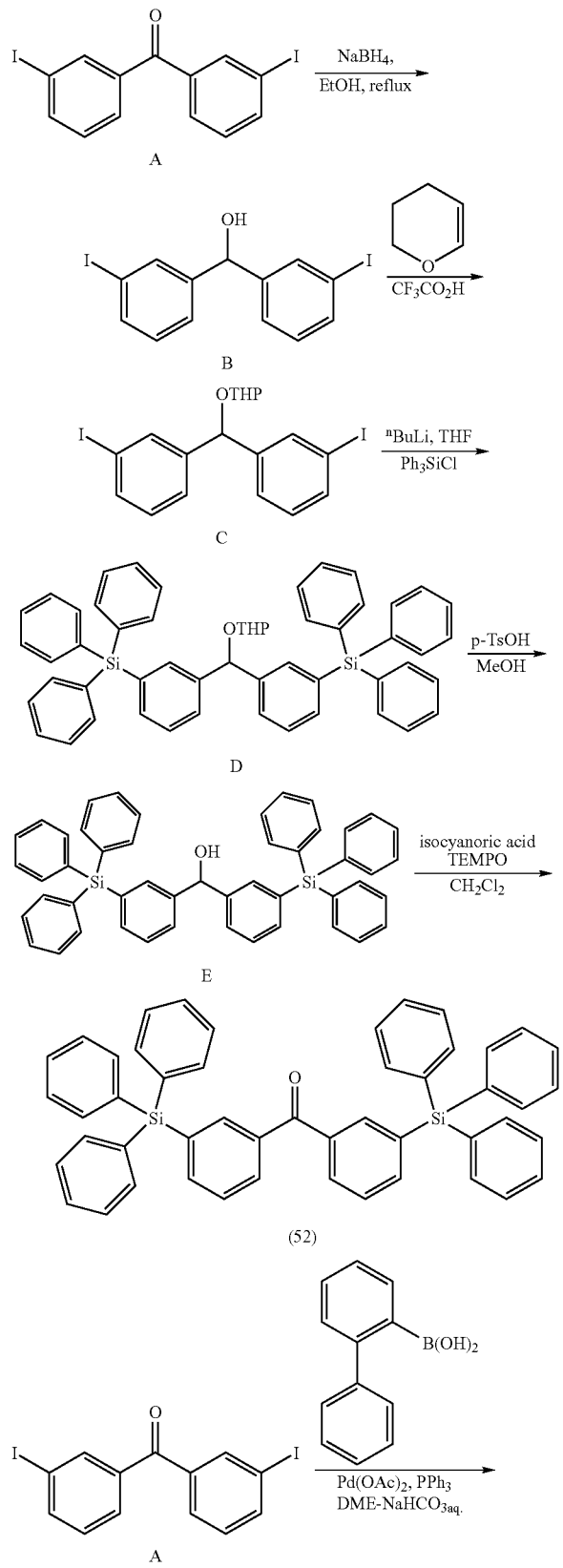

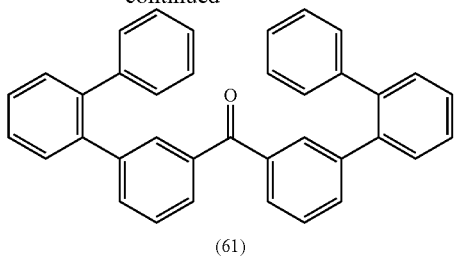

(61)

<Synthesis of Compound (52) of the Invention>

The compound (A) was synthesized according to "Bulletin of The Chemical Society of Japan 1999", (72), 1, 115-120. Into a 200 mL three-necked flask were charged 3.40 g (7.83 mmol) of the compound (A) and 17 ml of ethanol. To the mixture which was being stirred at room temperature was then added 0.46 g (12 mmol) of sodium borohydride. The mixture was then heated under reflux with stirring for 2 hours. The reaction mixture was then allowed to cool to room temperature. To the reaction mixture was then added acetone. The reaction mixture was then stirred for 1 hour. To the reaction mixture was then added water. The resulting aqueous phase was then extracted with ethyl acetate. The organic phase thus collected was then dried over anhydrous magnesium sulfate. The resulting inorganic salt was withdrawn by filtration, and then concentrated by a rotary evaporator to quantitatively obtain 3.50 g of the compound (B).

$^1$H-NMR (300 MHz, in CDCL$_3$): δ (ppm)=1.61 (br. s, 1H), 5.71 (br. s, 1H), 7.71 (t, 2H, J=7.8 Hz), 7.27-7.33 (m, 2H), 7.60-7.65 (m, 2H), 7.72-7.76 (m, 2H).

Into a 300 mL three-necked flask were charged 3.50 g (8.03 mmol) of the compound (B), 2.72 g (32.3 mmol) of dihydropyran and a droplet of trifluoroacetic acid. The mixture was stirred at room temperature for 7 hours, To the reaction mixture was then added saturated aqueous solution of sodium hydrogen carbonate. The resulting aqueous phase was then extracted with ethyl acetate. The organic phase thus collected was then dried over anhydrous magnesium sulfate. The resulting inorganic salt was withdrawn by filtration, and then concentrated by a rotary evaporator to obtain about 4 g of the compound (C). The compound (C) thus obtained was then not further purified before being subjected to the subsequent reaction, Into a 300 ml three-necked flask were charged 4.00 g (7.69 mmol) of the compound (C) and 40 ml of anhydrous tetrahydrofurane. To the mixture which was being stirred at −78° C. in a stream of nitrogen was then slowly added dropwise n-butyl lithium (1.0 M hexane solution; 9.60 ml: 15.4 mmol). The reaction mixture was then stirred as it was for 1 hour. To the reaction mixture was then slowly added dropwise a solution of 4.53 g (15.4 mmol) of triphenylsilyl chloride in THF (45 ml). The reaction mixture was stirred at −78° C. for 1 hour, slowly heated to room temperature, and then allowed to stand as it was overnight. To the reaction mixture was then added a saturated aqueous solution of ammonium chloride. The reaction mixture was then stirred at room temperature for 1 hour. The resulting aqueous phase was then extracted with ethyl acetate. The organic phase thus collected was then dried over anhydrous magnesium sulfate. The resulting organic phase was withdrawn by filtration, and then concentrated by a rotary evaporator to obtain about 6 g of the compound (D) in crude form. The compound (D) thus obtained was then readily subjected to the subsequent step without being further purified.

Into a 300 ml three-necked flask were charged the compound (D) in crude form, 40 ml of methanol and p-toluenesulfonic acid hydrate in a catalytic amount. The reaction mixture was then heated under reflux for 1 hour. Thereafter, to the reaction mixture was added saturated brine. The resulting aqueous phase was then extracted with ethyl acetate. The organic phase thus collected was then dried over anhydrous magnesium sulfate. The inorganic salt was withdrawn by filtration, and then concentrated by a rotary evaporator. The residue thus obtained was then dissolved in 20 ml of dichloromethane. To the solution were then added 0.6 g (2.6 mmol) of isocyanuric acid trichloride and a piece of TEMPO (2, 2, 6, 6-Tetramethylpiperidine 1-Oxyl). The mixture was then stirred at room temperature for 4 hours. Thereafter, the reaction mixture was then filtered through celite. The filtrate was washed with a saturated aqueous solution of sodium hydrogen carbonate, and then dried over anhydrous magnesium sulfate. The resulting inorganic salt was withdrawn by filtration, and then dried over anhydrous magnesium sulfate. The residue thus obtained was then purified through silica gel chromatography to obtain 0.84 g (yield: 15%, 4 steps) of the compound (52).

$^1$H-NMR (400 MHz, in $CDCL_3$); δ (ppm)=7.33-7.40 (m, 12H), 7.40-7.45 (m, 8H), 7.51-7.56 (m, 12H), 7.73-7.77 (m, 4H), 8.02 (br. s, 2H).

<Synthesis of Compound (61) of the Invention>

Into a 300 ml three-necked flask were charged 4.61 g (10.6 mmol) of the compound (A), 4.21 g (21.3 mmol) of 2-biphenylboronic acid, 0.56 g (2.1 mmol) of triphenylphosphine and 46 ml of 1,2-dimethoxyethane. The mixture which was being stirred were then added 0.12 g (0.54 mmol) of palladium acetate and 46 ml of saturated aqueous solution of sodium hydrogen carbonate. The reaction mixture was then heated under reflux for 5 hours. Thereafter, the reaction mixture was allowed to cool to room temperature. To the reaction mixture was then added water. The reaction mixture was then stirred. The resulting crude crystal was withdrawn by filtration, and then washed with water. The crude crystal thus obtained was heated under reflux with ethyl acetate so that it was completely dissolved in ethyl acetate, and then dried over anhydrous magnesium sulfate. The resulting inorganic salt was withdrawn by filtration, and then concentrated by a rotary evaporator. The residue thus obtained was then purified through silica gel chromatography to obtain 3.48 g (yield: 67.0%) of the compound (61) of the invention.

$^1$H-NMR (300 MHz, in $CDCL_3$): δ (ppm)=7.10-7.15 (m, 4H), 7.17-7.26 (m, 8H), 7.28-7.34 (m, 4H), 7.38-7.46 (m, 8H), 7.55 (br. t, 2H, J=4.7 Hz).

The light-emitting element containing the compound of the invention will be further described hereinafter. The light-emitting element of the invention may be used for ordinary light-emitting systems, driving methods, etc. in ordinary embodiments except in that it is an element comprising the compound of the invention. The compound represented by any of the formulae (I) to (V) is preferably used as a light-emitting material, host material, exciton-blocking material, charge-blocking material or charge-transporting material, more preferably as a host material, exciton-blocking material or charge-transporting material. The light-emitting material may be ultraviolet-emitting or infrared-emitting or may be fluorescence or phosphorescence. The charge-transporting material may be positive hole-transporting or electron-transporting. A representative example of the light-emitting element is an organic EL (electroluminescent) element.

[Organic Electroluminescent Element]

The organic electroluminescent element (hereinafter occasionally referred to as "organic EL element") will be further described hereinafter.

The light-emitting element of the invention comprises a cathode and an anode provided on a substrate and at least one organic layer (the organic layer may be a layer composed of only organic compounds, or may include inorganic compounds) containing at least an organic light-emitting layer (hereinafter occasionally referred to as "light-emitting layer") provided interposed therebetween. At least one of the cathode and the anode is preferably transparent from the standpoint of the properties of light-emitting element.

In a preferred embodiment of the lamination of the organic layer in the invention, a positive hole-transporting layer, a light-emitting layer and an electron-transporting layer are laminated in this order as viewed from the anode side. A charge-blocking layer or the like is preferably provided interposed between the positive hole-transporting layer and the light-emitting layer or between the light-emitting layer and the electron-transporting layer. A positive hole-injecting layer may be provided interposed between the anode and the positive hole-transporting layer. An electron-injecting layer may be provided interposed between the cathode and the electron-transporting layer. These layers may be each composed of a plurality of secondary layers.

The elements constituting the light-emitting material of the invention will be further described hereinafter.

<Substrate>

The substrate to be used in the invention preferably does not scatter or damp light emitted by the organic layer. Specific examples of the substrate include inorganic materials such as zirconia-stabilized yttrium (YSZ) and glass, and organic materials such as polyester, e.g., polyethylene terephthalate, polybutylene phthalate, polyethylene naphthalate, polystyrene, polycarbonate, polyether sulfone, polyarylate, polyimide, polycyclloolefin, norbornene resin and poly (chlorotrifluoroethylene).

Glass, if used as substrate, is preferably alkali-free glass to reduce the amount of ions eluted from glass. Soda-lime glass, if used as substrate, is preferably coated with a barrier such as silica. The organic material, if used as substrate, is preferably excellent in heat resistance, dimensional stability, solvent resistance, electrical insulation properties and workability.

The shape, structure, size and other factors of the substrate are not specifically limited and can be properly predetermined depending on the use, purpose, etc. of the light-emitting element to be provided thereon. In general, the shape of the substrate is preferably sheet-like. The substrate may have a single-layer structure or a laminated structure or may be formed by a single member or two or more members.

The substrate may be colorless and transparent or colored and transparent but is preferably colorless and transparent to prevent scattering or damping of light emitted by the organic light-emitting layer.

The substrate may have a moisture barrier layer (gas barrier layer) provided on one or the other side thereof.

As the material of the moisture barrier layer (gas barrier layer) there is preferably used an inorganic material such as silicon nitride and silicon oxide. The moisture barrier layer (gas barrier layer) can be formed by, e.g., high frequency sputtering method or the like.

When a thermosetting substrate is used, a hard coat layer, an undercoat layer or the like may be further provided as necessary.

<Anode>

Any anode may be normally used so far as it acts as an electrode capable of supplying positive holes to the organic layer. The shape, structure, size and other factors of the anode are not specifically limited. The anode can be properly selected from known electrode materials depending on the use and purpose of the light-emitting element. As previously mentioned, the anode is normally provided as a transparent anode.

Preferred examples of the material of the anode include metals, alloys, metal oxides, electrically-conductive compounds, and mixtures thereof. Specific examples of the anode material include tin oxide doped with antimony, fluorine or the like (ATO, FTO), electrically-conductive metal oxides such as tin oxide, zinc oxide, indium oxide, indium tin oxide (ITO) and zinc indium oxide (IZO), metals such as gold, silver, chromium and nickel, mixtures or laminates of these metals with these electrically-conductive metal oxides, inorganic electrically-conductive materials such as copper iodide and copper sulfide, organic electrically-conductive materials such as polyaniline, polythiophene and polypyrrole, and laminates of these materials with ITO. Preferred among these anode materials are electrically-conductive metal oxides. Particularly preferred among these electrically-conductive metal oxides is ITO from the standpoint of productivity, electrical conductivity, transparency, etc.

The anode can be formed on the aforementioned substrate according to a method which is properly selected from the group consisting of wet method such as printing method and coating method, physical method such as vacuum metallizing method, sputtering method and ion plating method and chemical method such as CVD method and plasma CVD method taking into account the adaptability to the material constituting the anode. When ITO is selected as the anode material, the formation of the anode can be carried out by dc or high frequency sputtering method, vacuum metallizing method, ion plating method or the like.

In the organic electroluminescent element of the invention, the position at which the anode is formed is not specifically limited and can be properly predetermined depending on the use and purpose of the light-emitting element but is preferably on the aforementioned substrate. In this case, the anode may be formed on the whole or part of one surface of the substrate.

The patterning for the formation of the anode may be carried out by a chemical etching method involving photolithography or the like or a physical etching method involving laser or the like. Alternatively, vacuum metallizing, sputtering or the like may be effected with a mask imposed on the substrate. Alternatively, patterning may be carried out by a lift-off method or printing method.

The thickness of the anode may be properly predetermined depending on the material constituting the anode and thus cannot be unequivocally predetermined but is normally from about 10 nm to 50 μm, preferably from 50 nm to 20 μm.

The resistivity of the anode is preferably $10^3 \Omega/\|$ or less, more preferably $10^2 \Omega/\square$ or less. In the case where the anode is transparent, the anode is colorless or colored. In order to allow light emission from the transparent anode side, the transmittance of the anode is preferably 60% or more, more preferably 70% or more.

For the details of transparent anodes, reference can be made to Yutaka Sawada, "Toumeidenkyokumaku no shintenkai (New Development of Transparent Electrode Films)", CMC, 1999. The contents disclosed in the aforementioned citation can be applied to the invention. In the case where a plastic substrate having a low heat resistance is used, ITO or IZO is preferably subjected to film formation at a temperature as low as 150° C. or less to form a transparent anode.

<Cathode>

Any cathode may be normally used so far as it acts as an electrode capable of supplying electrons to the organic layer. The shape, structure, size and other factors of the cathode are not specifically limited. The cathode can be properly selected from known electrode materials depending on the use and purpose of the light-emitting element.

Examples of the material constituting the cathode include metals, alloys, metal oxides, electrically-conductive compounds, and mixtures thereof. Specific examples of the cathode material include alkaline metals (e.g., Li, Na, K, Cs), alkaline earth metals (e.g., Mg, Ca), gold, silver, lead, aluminum, sodium-potassium alloy, lithium-aluminum alloy, magnesium-silver alloy, indium, and rare earth metals such as ytterbium. These cathode materials may be used singly used. However, these cathode materials can be used in combination of two or more thereof to advantage from the standpoint of accomplishment of both stability and electron injecting properties.

Preferred among these cathode materials are alkaline metals and alkaline rare earth metals from the standpoint of electron injecting properties or aluminum-based materials from the standpoint of storage stability.

The term "aluminum-based materials" as used herein is meant to include aluminum in simple body, and alloy of mixture of aluminum with from 0.01% to 10% by mass of alkaline metal or alkaline earth metal (e.g., lithium-aluminum alloy, magnesium-aluminum alloy). (In this specification, mass ratio is equal to weight ratio.)

For the details of cathode materials, reference can be made to JP-A-2-15595 and JP-A-5-121172. The materials disclosed in these citations can be applied also to the invention.

The formation of the cathode is not specifically limited and can be accomplished by any known methods. The cathode can be formed according to a method which is properly selected from the group consisting of wet method such as printing method and coating method, physical method such as vacuum metallizing method, sputtering method and ion plating method and chemical method such as CVD method and plasma CVD method taking into account the adaptability to the material constituting the cathode. For example, when metals or the like are selected as cathode material, one or more of these materials can be simultaneously or successively sputtered or otherwise processed.

The patterning for the formation of the cathode may be carried out by a chemical etching method involving photolithography or the like or a physical etching method involving laser or the like. Alternatively, vacuum metallizing, sputtering or the like may be effected with a mask imposed on the substrate. Alternatively, patterning may be carried out by a lift-off method or printing method.

In the invention, the position at which the cathode is formed is not specifically limited. The cathode may be formed on the whole or part of the organic layer.

Further, a dielectric material layer made of a fluoride or oxide of alkaline metal or alkaline earth metal or the like may be provided interposed between the cathode and the organic layer to a thickness of from 0.1 nm to 5 nm. This dielectric material layer can be regarded also as an electron injecting layer. The dielectric layer can be formed by vacuum metallizing method, sputtering method, ion plating method or the like.

The thickness of the cathode can be properly predetermined depending on the material constituting the cathode and thus cannot be unequivocally predetermined but is normally from about 10 nm to 5 μm, preferably from 50 nm to 1 μm.

The cathode may be transparent or opaque. The transparent cathode can be formed by depositing a cathode material to a thickness as small as from 1 nm to 10 nm, and then laminating a transparent electrically-conductive material such as ITO and IZO on the thin film.

<Organic layer>

The organic layer of the invention will be further described hereinafter.

The organic electroluminescent element of the invention comprises at least one organic layer containing a light-emitting layer. As previously mentioned, examples of the organic layers other than organic light-emitting layer include various layers such as positive hole-transporting layer, electron-transporting layer, charge-blocking layer, positive hole-injecting layer and electron-injecting layer.

Formation of Organic Layer

In the organic electroluminescent element of the invention, the various layers constituting the organic layer can be fairly formed by any of dry film-forming method such as vacuum metallizing method and sputtering method, transfer method and printing method.

Organic Light-Emitting Layer

The organic light-emitting layer is a layer capable of receiving positive holes from the anode, the positive hole-injecting layer or the positive hole-transporting layer and electrons from the cathode, the electron-injecting layer or the electron-transporting layer during the application of an electric field to provide a site for the recombination of positive holes with electrons, causing light emission.

The light-emitting layer in the invention may be formed by a light-emitting material alone or a host material and a light-emitting material in admixture. The light-emitting material may be a fluorescent material or a phosphorescent material. One or more dopants may be used. The host material may be a charge-transporting material. One or more host materials may be used. For example, an electron-transporting host material and a hole-transporting host material may be used in admixture. The light-emitting layer may further contains a material which neither has charge-transporting properties nor emits light.

The light-emitting layer may consist of one or more layers which may emit lights having different colors, respectively.

Examples of the fluorescent material which can be used in combination with the compound represented by the formula (I) of the invention include benzooxazole derivatives, benzoimidazole derivatives, benzothiazole derivatives, styrylbetzene derivatives, polyphenyl derivatives, diphenylbutadiene derivatives, tetraphenylbutadiene derivatives, naphthalimide derivatives, coumarine derivatives, condensed aromatic compounds, perynone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazopyridine derivatives, cyclopentadiene derivatives, styrylamine derivatives, diketopyrrolopyrole derivatives, aromatic dimethylidine compounds, various metal complexes such as metal complex of 8-quinolyl derivatives and metal complex of pyromethene derivatives, polymer compounds such as polythiqphene, polyphenylene and polyphenylenevinylene, and compounds such as organic silane derivative.

Examples of the ligands to be incorporated in these complexes include those disclosed in G. Wilkinson et al, "Comprehensive Coordination Chemistry", Pergamon Press, 1987, H. Yersin, "Photochemistry and Photophysics of Coordination Compounds", Springer-Verlag, 1987, Akio Yamomoto, "Yukikinzokukagaku-Kiso to Oyo-(Organic Metal Chemistry—Basic Study and Application)", Shokabo, 1982, etc.

Specific preferred examples of the ligands include halogen ligands (preferably chlorine ligands), nitrogen-containing heterocyclic ligands (preferably phenylpyridine, benzoquinoline, quinolyl, bipyridyl, phenanthroline, etc.), diketone ligands (e.g., acetylacetone), carboxylic acid ligands (e.g., acetic acid ligand), carbon monoxide ligand, isonitrile ligand, and cyano ligand. More desirable among these ligands are nitrogen-containing heterocyclic ligands. The aforementioned complex may have one transition metal atom incorporated therein or may be a so-called binuclear complex having two or more transition metal atoms incorporated therein. The complex may have different metal atoms incorporated therein at the same time.

The phosphorescent material may be incorporated in the light-emitting layer in an amount of from 0.1% to 40% by mass, more preferably from 0.5% to 20% by mass.

The phosphorescent material is preferably a platinum complex or an iridium complex, more preferably a platinum complex. As a specific example thereof, the platinum complex described in WO 2004/108857 is more preferable.

Examples of the host material to be incorporated in the light-emitting layer of the invention include those having a carbazole skeleton, those having a diarylamine skeleton, those having a pyridine skeleton, those having a pyrazine skeleton, those having a triazine skeleton, those having a arylsilane skeleton, and materials exemplified later with reference to positive hole-injecting layer, positive hole-transporting layer, electron-injecting layer and electron-transporting layer.

The thickness of the light-emitting layer is not specifically limited but is normally preferably from 1 nm to 500 nm, more preferably from 5 nm to 200 nm, even more preferably from 10 nm to 100 nm.

Positive Hole-Injecting Layer, Positive Hole-Transporting Layer

The positive hole-injecting layer and the positive hole-transporting layer each are a layer capable of receiving positive holes from the anode or anode side and then transporting them to the cathode side. The positive hole-injecting layer and the positive hole-transporting layer each preferably are a layer containing a carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino-substituted chalcone derivative, styrylanthracene derivative, fluorenone derivative, hydrazone derivative, stilbene derivative, silazalane derivative, aromatic tertiary amine compound, styrylamine compound, aromatic dimethylidene-based compound, porphiline-based compound, organic silane derivative, carbon or the like.

The thickness of the positive hole-injecting layer and the positive hole-transporting layer each preferably are 500 nm or less to lower the required driving voltage.

The thickness of the positive hole-transporting layer is preferably from 1 nm to 500 nm, more preferably from 5 nm to 200 nm, even more preferably from 10 nm to 100 nm. The thickness of the positive hole-injecting layer is preferably from 0.1 nm to 200 nm, more preferably from 0.5 nm to 100 nm, even more preferably from 1 nm to 100 nm.

The positive hole-injecting layer and the positive hole-transporting layer each may be a single layer structure composed of one or more of the aforementioned materials or a multi-layer structure composed of a plurality of layers having the same or different compositions.

Electron-Injecting Layer, Electron-Transporting Layer

The electron-injecting layer and the electron-transporting layer each are a layer capable of receiving electrons from the cathode or anode and then transporting them to the anode side. The electron-injecting and the electron-transporting layer each preferably are a layer containing a triazole derivative, oxazole derivative, oxadiazole derivative, imidazole derivative, fluorenone derivative, anthraquinodimethane derivative, anthrone derivative, diphenylquinone derivative, thiopyrandioxide derivative, carbodiimide derivative, fluorenylidenemethane derivative, distyrylpyrazine derivative, naphthalene and aromatic tetracarboxylic anhydride, phthalocyanine derivative, various metal complexes such as metal complex of 8-quinolyl derivative and metal complex having metal phthalocyanine, benzooxazole or benzothiazole as ligand, organic silane derivative or the like.

The thickness of the electron-injecting layer and the electron-transporting layer each are preferably 50 nm or less to lower the required driving voltage.

The thickness of the electron-transporting layer is preferably from 1 nm to 500 nm, more preferably from 5 nm to 200 nm, even more preferably from 10 nm to 100 nm. The thickness of the electron-transporting layer is preferably from 0.1 nm to 200 nm, more preferably from 0.2 nm to 100 nm, even more preferably from 0.5 nm to 50 nm.

The electron-injecting layer and the electron-transporting layer each may be a single layer structure composed of one or more of the aforementioned materials or a multi-layer structure composed of a plurality of layers having the same or different compositions.

Positive Hole-Blocking Layer

The positive hole-blocking layer is a layer capable of preventing positive holes which have been transported from the anode side to the light-emitting layer from passing to the cathode side. In the invention, a positive hole-blocking layer may be provided as an organic layer-adjacent to the light-emitting layer on the cathode side thereof.

Examples of the organic compound constituting the positive hole-blocking layer include aluminum complexes such as BAlq, triazole derivatives, and phenanthroline derivatives such as BCP.

The thickness of the positive hole-blocking layer is preferably from 1 nm to 500 nm, more preferably from 5 nm to 200 nm, even more preferably from 10 nm to 100 nm.

The positive hole-blocking layer may be a single layer structure composed of one or more of the aforementioned materials or a multi-layer structure composed of a plurality of layers having the same or different compositions.

<Protective Layer>

In the invention, the organic EL element may be entirely protected by a protective layer.

The materials to be incorporated in the protective layer may be any materials capable of preventing materials which accelerate the deterioration of the element such as water content and oxygen from entering in the element.

Specific examples of the materials to be incorporated in the protective layer include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal nitrides such as $SiN_x$ and $SiN_xO_y$, metal fluorides such as $MgF_2$, LiF, $AlF_3$ and $CaF_2$, polyethylenes, polypropylenes, polymethyl methacrylates, polyimides, polyureas, polytetrafluoroethylenes, polychloro trifluoroethylenes, polydicblorodifluoroethylene, copolymers of chlorotrifluoroethylene with dichlorodifluoroethylene, copolymers obtained by the copolymerizatin of tetrafluoroethylene with a monomer mixture containing at least one comonomer, fluorine-containing copolymers having a cyclic structure in its copolymer main chain, hygroscopic materials having a percent water absorption of 1% or more, and moistureproof materials having a percent water content of 0.1% or less.

The method for forming the protective layer is not specifically limited. For example, vacuum metallizing method, sputtering method, reactive sputtering method, MBE (Molecular Beam Epitaxy) method, cluster-ion beam method, ion plating method, plasma polymerization method (high frequency excited ion plating method), plasma CVD method, laser CVD method, hot CVD method, gas source CVD method, coating method, printing method or transfer method may be applied.

<Encapsulation>

The organic electroluminescent element of the invention may be entirely encapsulated using an encapsulating vessel.

The space between the encapsulating vessel and the light-emitting element may be filled with a water absorber or an inert liquid. The water absorbing agent is not specifically limited. Examples of the water absorbing agent employable herein include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, and magnesium oxide. The inert liquid is not specifically limited. Examples of the inert liquid employable herein include paraffins, liquid paraffins, fluorine-based solvents such as perfluoroalkane, perfluoroamine and perfluoroether, chlorine-based solvents, and silicone oils.

The organic electroluminescent element of the invention can emit light when dc voltage (normally from 2 volt to 15 volt, optionally including ac components) is applied across the anode and the cathode or dc current is allowed to flow from the anode to the cathode.

In order to drive the organic electroluminescent element of the invention, a driving method disclosed in JP-A-2-148687, JP-A-6-301355, JP-A-5-29080, JP-A-7-134558, JP-A-8-234685, JP-A-8-241047, Japanese Patent Application No. 2784615, and U.S. Pat. Nos. 5,828,429 and 6,023,308 may be applied.

EXAMPLES

The invention is now described in the following Examples, but the invention is never limited by them.

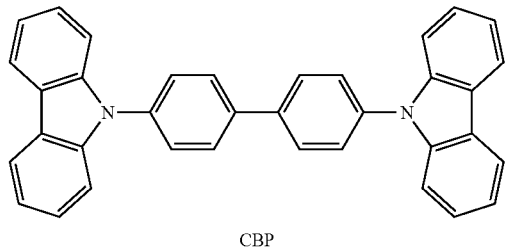

CBP

-continued

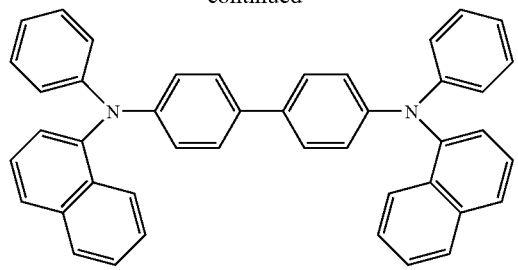

NPD

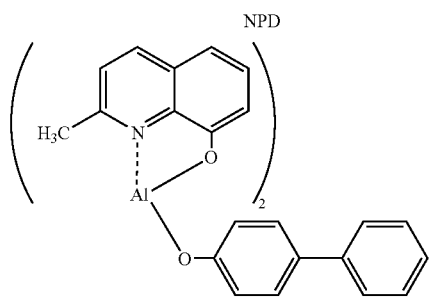

BAlq

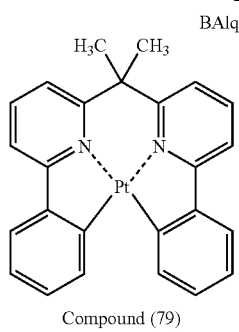

Compound (79)

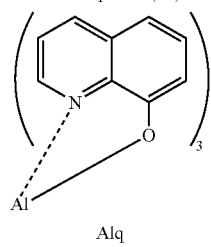

Alq

Comparative Example 1

A substrate with a rinsed ITO electrodeposition layer was placed in a vapor deposition apparatus, onto which NPD was vapor-deposited to 50 nm. CBP and Compound (79) (a compound described in WO 2004/108857) were additionally vapor-deposited at a mass ratio of 10:1 thereon to 40 nm, onto which BAlq was vapor-deposited to 3 nm. Still further, Alq was vapor-deposited thereon to 30 nm. A patterned musk (to a luminescent area of 4 mm+5 mm) was mounted on the resulting organic film, followed by 3-nm vapor deposition of lithium fluoride and subsequent 60-nm vapor deposition of aluminium, to prepare the organic EL element of Comparative Example 1. When a DC constant current passed through the resulting organic EL element at a current density of 500 A/m$^2$, luminescence could be observed. The driving voltage then was 12.5 V. The driving voltage was increased to 14.5 V via 10-hour luminescence at a brightness of 300 cd/m$^2$.

Example 1

In the same manner as in Comparative Example 1 except for the use of the inventive compound (52) instead of BAlq in Comparative Example 1, the organic EL element of Example 1 was prepared. When a DC constant current passed through the resulting organic EL element at a current density of 500 A/m$^2$, luminescence could be observed. The driving voltage then was 12.0 V. The driving voltage was increased to 13.5 V via 10-hour luminescence at a brightness of 300 cd/m$^2$. However, the increment of the driving voltage was small, compared with Comparative Example 1.

Using the inventive compounds (1) and (41) instead of the inventive compound (52) in Example 1, similarly, the driving voltage could be reduced.

In accordance with the invention, a light-emitting element having a low required driving voltage can be provided.

The organic electroluminescent element of the invention can be used in the art of display element, display, backlight, electrophotography, illumination light source, recording light source, exposure light source, reading light source, sign, signboard, interior, optical communication, etc. The compound of the invention can be applied also to medical use, fluorescent brightening agent, photographic material, UV-absorbing material, laser dye, recording media material, ink jet pigment, color filter dye, color conversion filter, analysis, etc.

The entire disclosure of each and every foreign patent application from which the benefit of foreign priority has been claimed in the present application is incorporated herein by reference, as if fully set forth.

What is claimed is:

1. An organic electroluminescent element, which comprises:
   a pair of electrodes; and
   at least one organic layer comprising a light-emitting layer between the pair of electrodes,
   wherein the at least one organic layer comprises at least one of compounds represented by formula (IV):

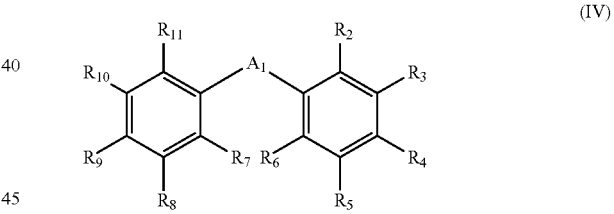

(IV)

wherein A$_1$ in formula (IV) is group (c):

(a)

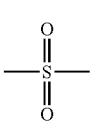

(b)

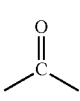

(c)

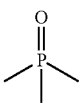

(d)

-continued (e)
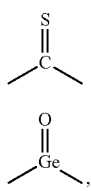

(h)
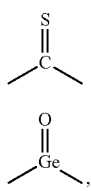

$R_2$, $R_6$, $R_7$ and $R_{11}$ each independently represent an alkyl group, cycloalkyl group, alkenyl group, alkynyl group, aryl group, amino group, alkoxy group, aryloxy group, heterocyclic oxy group, alkylthio group, arylthio group, heterocyclic thio group, heterocyclic group, hydroxyl group, halogen atom or cyano group, and $R_3$, $R_4$, $R_5$, $R_8$, $R_9$ and $R_{10}$ each independently represent a hydrogen atom, aryl group, or heterocyclic group.

2. An organic electroluminescent element, which comprises:
a pair of electrodes; and
at least one organic layer comprising a light-emitting layer between the pair of electrodes,
wherein the at least one organic layer comprises at least one of compounds represented by formula (V):

(III)
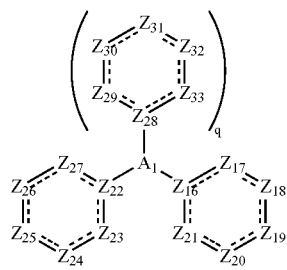

wherein $A_1$ in formula (V) is a group selected from the group consisting of groups (a), (b), (c), (d), (e) and (h) among compound group (I):

Compound group (I):

(a)
(b)
(c)
(d)
(e)
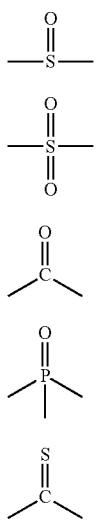

-continued (h)
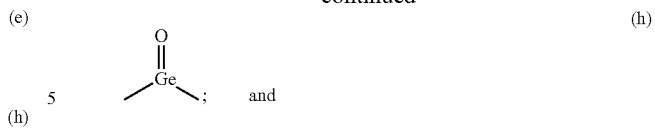
and $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$ and $R_{25}$ each independently represent a hydrogen atom, alkyl group, cycloalkyl group, alkenyl group, alkynyl group, aryl group, alkoxy group, aryloxy group, heterocyclic oxy group, alkylthio group, arylthio group, heterocyclic thio group, heterocyclic group, halogen atom or cyano group.

3. The organic electroluminescent element according to claim 1,
wherein the light-emitting layer comprises at least one triplet light-emitting material.

4. The organic electroluminescent element according to claim 3, wherein the at least one triplet light-emitting material contained in the light-emitting layer is a platinum complex or an iridium complex.

5. The organic electroluminescent element according to claim 1,
wherein the lowest excited triplet energy level $T_1$ of the compound represented by formula (IV) is from not lower than 65 kcal/mol (272.35 kJ/mol) to not higher than 95 kcal/mol (398.05 kJ/mol).

6. The organic electroluminescent element according to claim 1,
wherein a glass transition temperature Tg of the compound represented by formula (IV) is from not lower than 130° C. to not higher than 400° C.

7. The organic electroluminescent element according to claim 2, wherein $A_1$ in formula (V) is group (c) among the compound group (I).

8. An organic electroluminescent element, which comprises:
a pair of electrodes; and
at least one organic layer comprising a light-emitting layer between the pair of electrodes,
wherein the at least one organic layer comprises at least one of compounds represented by formula (IV):

(IV)
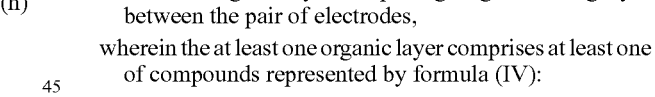

wherein $A_1$ in formula (IV) is a group selected from the group consisting of groups (a), (b), (c), (d), (e) and (h) among compound group (I):

Compound group (I):

(a)

-continued

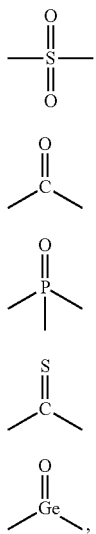

$R_2$, $R_6$, $R_7$ and $R_{11}$ each independently represent an aryl group or a heterocyclic group, and $R_3$, $R_4$, $R_5$, $R_8$, $R_9$ and $R_{10}$ each independently represent a hydrogen atom, alkyl group, cycloalkyl group, alkenyl group, alkynyl group, aryl group, amino group, alkoxy group, aryloxy group, heterocyclic oxy group, alkylthio group, arylthio group, heterocyclic thio group, heterocyclic group, hydroxyl group, halogen atom or cyano group, with the proviso that when $A_1$ is group (c), $R_3$, $R_4$, $R_5$, $R_9$, $R_9$ and $R_{10}$ each independently represent a hydrogen atom, aryl group, or heterocyclic group.

9. The organic electroluminescent element according to claim 8,
wherein the light-emitting layer comprises at least one triplet light-emitting material.

10. The organic electroluminescent element according to claim 9, wherein the at least one triplet light-emitting material contained in the light-emitting layer is a platinum complex or an iridium complex.

11. The organic electroluminescent element according to claim 8,
wherein the lowest excited triplet energy level $T_1$ of the compound represented by formula (IV) is from not lower than 65 kcal/mol (272.35 kJ/mol) to not higher than 95 kcal/mol (398.05 kJ/mol).

12. The organic electroluminescent element according to claim 8,
wherein a glass transition temperature Tg of the compound represented by formula (IV) is from not lower than 130° C. to not higher than 400° C.

13. An organic electroluminescent element, which comprises:
a pair of electrodes; and
at least one organic layer comprising a light-emitting layer between the pair of electrodes,
wherein the at least one organic layer comprises at least one of compounds represented by formula (IV):

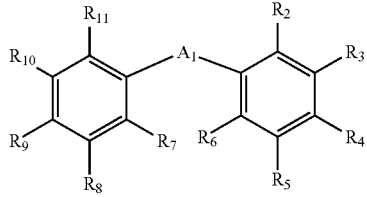

(IV)

wherein $A_1$ in formula (IV) is a group selected from the group consisting of groups (a), (b), (c), (d), (e) and (h) among compound group (I):
Compound group (I):

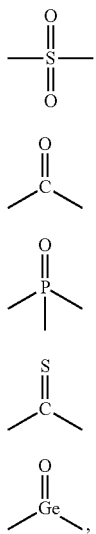

$R_2$, $R_6$, $R_7$ and $R_{11}$ each independently represent an aryl group or a heterocyclic group, and $R_3$, $R_4$, $R_5$, $R_8$, $R_9$ and $R_{10}$ each independently represent a hydrogen atom, aryl group, or heterocyclic group.

* * * * *